United States Patent
Oggier

(10) Patent No.: US 12,117,286 B2
(45) Date of Patent: Oct. 15, 2024

(54) DEPTH SENSING USING A SPARSE ARRAY OF PULSED BEAMS

(71) Applicant: APPLE INC., Cupertino, CA (US)

(72) Inventor: Thierry Oggier, San Jose, CA (US)

(73) Assignee: APPLE INC., Cupertino, CA (US)

( * ) Notice: Subject to any disclaimer, the term of this patent is extended or adjusted under 35 U.S.C. 154(b) by 1382 days.

(21) Appl. No.: 16/532,513

(22) Filed: Aug. 6, 2019

(65) Prior Publication Data

US 2020/0256993 A1 Aug. 13, 2020

Related U.S. Application Data

(60) Provisional application No. 62/809,647, filed on Feb. 24, 2019, provisional application No. 62/803,612, filed on Feb. 11, 2019.

(51) Int. Cl.

| G01B 11/22 | (2006.01) |
|---|---|
| G01S 7/48 | (2006.01) |
| G01S 7/4865 | (2020.01) |
| G01S 17/10 | (2020.01) |
| G01S 17/89 | (2020.01) |
| H01L 31/107 | (2006.01) |

(Continued)

(52) U.S. Cl.
CPC ............ G01B 11/22 (2013.01); G01S 7/4865 (2013.01); G01S 17/10 (2013.01); G01S 17/89 (2013.01); H01L 31/107 (2013.01); H01S 5/183 (2013.01); H01S 5/32 (2013.01)

(58) Field of Classification Search
None
See application file for complete search history.

(56) References Cited

U.S. PATENT DOCUMENTS

| 4,623,237 A | 11/1986 | Kaneda et al. |
|---|---|---|
| 4,757,200 A | 7/1988 | Shepherd |

(Continued)

FOREIGN PATENT DOCUMENTS

| CA | 2605339 C | 10/1994 |
|---|---|---|
| CN | 201054040 Y | 4/2008 |

(Continued)

OTHER PUBLICATIONS

U.S. Appl. No. 15/844,665 office action dated Jun. 1, 2020.

(Continued)

*Primary Examiner* — Mikhail Itskovich
(74) *Attorney, Agent, or Firm* — MEITAR PATENTS LTD.

(57) ABSTRACT

Depth sensing apparatus includes a radiation source, including a first array of emitters arranged in multiple banks, which are configured to emit a first plurality of pulsed beams of optical radiation toward a target scene. A second plurality of sensing elements are arranged in a second array and are configured to output signals indicative of respective times of incidence of photons on the sensing elements, wherein the second plurality exceeds the first plurality. Objective optics form an image of the target scene on the array of sensing elements. Processing and control circuitry actuates the multiple banks in alternation and identifies, responsively to the output signals, areas of the second array on which the pulses of optical radiation reflected from corresponding regions of the target scene are incident.

20 Claims, 7 Drawing Sheets

(51) Int. Cl.
*H01S 5/183* (2006.01)
*H01S 5/32* (2006.01)

(56) References Cited

U.S. PATENT DOCUMENTS

| | | |
|---|---|---|
| 5,164,823 A | 11/1992 | Keeler |
| 5,270,780 A | 12/1993 | Moran et al. |
| 5,373,148 A | 12/1994 | Dvorkis et al. |
| 5,699,149 A | 12/1997 | Kuroda et al. |
| 6,301,003 B1 | 10/2001 | Shirai et al. |
| 6,384,903 B1 | 5/2002 | Fuller |
| 6,710,859 B2 | 3/2004 | Shirai et al. |
| 7,126,218 B1 | 10/2006 | Darveaux et al. |
| 7,193,690 B2 | 3/2007 | Ossig et al. |
| 7,303,005 B2 | 12/2007 | Reis et al. |
| 7,405,812 B1 | 7/2008 | Bamji |
| 7,508,496 B2 | 3/2009 | Mettenleiter et al. |
| 7,800,067 B1 | 9/2010 | Rajavel et al. |
| 7,800,739 B2 | 9/2010 | Rohner et al. |
| 7,812,301 B2 | 10/2010 | Oike et al. |
| 7,969,558 B2 | 6/2011 | Hall |
| 8,193,482 B2 | 6/2012 | Itsler |
| 8,259,293 B2 | 9/2012 | Andreou |
| 8,275,270 B2 | 9/2012 | Shushakov et al. |
| 8,279,418 B2 | 10/2012 | Yee et al. |
| 8,355,117 B2 | 1/2013 | Niclass |
| 8,405,020 B2 | 3/2013 | Menge |
| 8,675,181 B2 | 3/2014 | Hall |
| 8,736,818 B2 | 5/2014 | Weimer et al. |
| 8,766,164 B2 | 7/2014 | Sanfilippo et al. |
| 8,766,808 B2 | 7/2014 | Hogasten |
| 8,925,814 B1 | 1/2015 | Schneider et al. |
| 8,963,069 B2 | 2/2015 | Drader et al. |
| 9,002,511 B1 | 4/2015 | Dickerson et al. |
| 9,024,246 B2 | 5/2015 | Jiang et al. |
| 9,052,356 B2 | 6/2015 | Chu et al. |
| 9,076,707 B2 | 7/2015 | Harmon |
| 9,016,849 B2 | 8/2015 | Duggal et al. |
| 9,335,220 B2 | 5/2016 | Shpunt et al. |
| 9,354,332 B2 | 5/2016 | Zwaans et al. |
| 9,465,111 B2 | 10/2016 | Wilks et al. |
| 9,516,248 B2 | 12/2016 | Cohen et al. |
| 9,709,678 B2 | 7/2017 | Matsuura |
| 9,736,459 B2 | 8/2017 | Mor et al. |
| 9,739,881 B1 | 8/2017 | Pavek et al. |
| 9,761,049 B2 | 9/2017 | Naegle et al. |
| 9,786,701 B2 | 10/2017 | Mellot et al. |
| 9,810,777 B2 | 11/2017 | Williams et al. |
| 9,874,635 B1 | 1/2018 | Eichenholz et al. |
| 9,997,551 B2 * | 6/2018 | Mandai .............. G01S 7/497 |
| 10,063,844 B2 | 8/2018 | Adam et al. |
| 10,067,224 B2 | 9/2018 | Moore et al. |
| 10,132,616 B2 | 11/2018 | Wang |
| 10,215,857 B2 | 2/2019 | Oggier et al. |
| 10,269,104 B2 | 4/2019 | Hannuksela et al. |
| 10,386,487 B1 | 8/2019 | Wilton et al. |
| 10,424,683 B1 | 9/2019 | Do Valle et al. |
| 10,613,203 B1 | 4/2020 | Rekow et al. |
| 10,782,393 B2 | 9/2020 | Dussan et al. |
| 11,693,102 B2 | 7/2023 | Kudla et al. |
| 2001/0020673 A1 | 9/2001 | Zappa et al. |
| 2002/0071126 A1 | 6/2002 | Shirai et al. |
| 2002/0131035 A1 | 9/2002 | Watanabe et al. |
| 2002/0154054 A1 | 10/2002 | Small |
| 2002/0186362 A1 | 12/2002 | Shirai et al. |
| 2004/0051859 A1 | 3/2004 | Flockencier |
| 2004/0135992 A1 | 7/2004 | Munro |
| 2004/0212863 A1 | 10/2004 | Schanz et al. |
| 2005/0018200 A1 | 1/2005 | Guillermo et al. |
| 2006/0044546 A1 | 3/2006 | Lewin et al. |
| 2006/0106317 A1 | 5/2006 | McConnell et al. |
| 2006/0176469 A1 | 8/2006 | O'Connor et al. |
| 2007/0145136 A1 | 6/2007 | Wiklof et al. |
| 2007/0164004 A1 | 7/2007 | Matsuda et al. |
| 2008/0231498 A1 | 9/2008 | Menzer et al. |
| 2009/0009747 A1 | 1/2009 | Wolf et al. |
| 2009/0262760 A1 | 10/2009 | Krupkin et al. |
| 2009/0273770 A1 | 11/2009 | Bauhahn et al. |
| 2009/0275841 A1 | 11/2009 | Melendez et al. |
| 2010/0019128 A1 | 1/2010 | Itzler |
| 2010/0045965 A1 | 2/2010 | Meneely |
| 2010/0096459 A1 | 4/2010 | Gurevich |
| 2010/0121577 A1 | 5/2010 | Zhang et al. |
| 2010/0250189 A1 | 9/2010 | Brown |
| 2010/0286516 A1 | 11/2010 | Fan et al. |
| 2010/0309288 A1 | 12/2010 | Stettner et al. |
| 2011/0006190 A1 | 1/2011 | Alameh et al. |
| 2011/0128524 A1 | 6/2011 | Vert et al. |
| 2011/0181864 A1 | 7/2011 | Schmitt et al. |
| 2011/0279366 A1 | 11/2011 | Lohbihler |
| 2012/0038904 A1 | 2/2012 | Fossum et al. |
| 2012/0075615 A1 | 3/2012 | Niclass et al. |
| 2012/0132636 A1 | 5/2012 | Moore |
| 2012/0153120 A1 | 6/2012 | Baxter |
| 2012/0154542 A1 | 6/2012 | Katz et al. |
| 2012/0176476 A1 | 7/2012 | Schmidt et al. |
| 2012/0249998 A1 | 10/2012 | Eisele et al. |
| 2012/0287242 A1 | 11/2012 | Gilboa et al. |
| 2012/0294422 A1 | 11/2012 | Cheung et al. |
| 2013/0015331 A1 | 1/2013 | Birk et al. |
| 2013/0079639 A1 | 3/2013 | Hoctor et al. |
| 2013/0092846 A1 | 4/2013 | Henning et al. |
| 2013/0107016 A1 | 5/2013 | Federspiel |
| 2013/0208258 A1 | 8/2013 | Eisele et al. |
| 2013/0236171 A1 | 9/2013 | Saunders |
| 2013/0258099 A1 | 10/2013 | Ovsiannikov et al. |
| 2013/0278917 A1 | 10/2013 | Korekado et al. |
| 2013/0300838 A1 | 11/2013 | Borowski |
| 2013/0342835 A1 | 12/2013 | Blacksberg |
| 2014/0027606 A1 | 1/2014 | Raynor et al. |
| 2014/0071433 A1 | 3/2014 | Eisele et al. |
| 2014/0077086 A1 | 3/2014 | Batkilin et al. |
| 2014/0078491 A1 | 3/2014 | Eisele et al. |
| 2014/0162714 A1 | 6/2014 | Kim et al. |
| 2014/0191115 A1 | 7/2014 | Webster et al. |
| 2014/0198198 A1 | 7/2014 | Geissbuehler et al. |
| 2014/0231630 A1 | 8/2014 | Rae et al. |
| 2014/0240317 A1 | 8/2014 | Go et al. |
| 2014/0240691 A1 | 8/2014 | Mheen et al. |
| 2014/0268127 A1 | 9/2014 | Day |
| 2014/0300907 A1 | 10/2014 | Kimmel |
| 2014/0321862 A1 | 10/2014 | Frohlich et al. |
| 2014/0353471 A1 | 12/2014 | Raynor et al. |
| 2015/0041625 A1 | 2/2015 | Dutton et al. |
| 2015/0062558 A1 | 3/2015 | Koppal et al. |
| 2015/0131080 A1 | 5/2015 | Retterath et al. |
| 2015/0163429 A1 | 6/2015 | Dai et al. |
| 2015/0192676 A1 | 7/2015 | Kotelnikov et al. |
| 2015/0200222 A1 | 7/2015 | Webster |
| 2015/0200314 A1 | 7/2015 | Webster |
| 2015/0204978 A1 | 7/2015 | Hammes et al. |
| 2015/0229912 A1 * | 8/2015 | Masalkar .............. H04N 13/254 348/46 |
| 2015/0260830 A1 | 9/2015 | Ghosh et al. |
| 2015/0285625 A1 | 10/2015 | Deane et al. |
| 2015/0362585 A1 | 12/2015 | Ghosh et al. |
| 2015/0373322 A1 | 12/2015 | Goma et al. |
| 2016/0003944 A1 | 1/2016 | Schmidtke et al. |
| 2016/0041266 A1 | 2/2016 | Smits |
| 2016/0072258 A1 | 3/2016 | Seurin et al. |
| 2016/0080709 A1 | 3/2016 | Viswanathan et al. |
| 2016/0182101 A1 | 6/2016 | Marcovic et al. |
| 2016/0259038 A1 | 9/2016 | Retterath et al. |
| 2016/0259057 A1 | 9/2016 | Ito |
| 2016/0274222 A1 | 9/2016 | Yeun |
| 2016/0334508 A1 | 11/2016 | Hall et al. |
| 2016/0344965 A1 | 11/2016 | Grauer |
| 2017/0006278 A1 | 1/2017 | Vandame et al. |
| 2017/0038459 A1 | 2/2017 | Kubacki et al. |
| 2017/0052065 A1 | 2/2017 | Sharma et al. |
| 2017/0067734 A1 | 3/2017 | Heidemann et al. |
| 2017/0068393 A1 | 3/2017 | Viswanathan et al. |
| 2017/0131388 A1 | 5/2017 | Campbell et al. |
| 2017/0131718 A1 | 5/2017 | Matsumura et al. |

(56) References Cited

U.S. PATENT DOCUMENTS

| | | |
|---|---|---|
| 2017/0139041 A1 | 5/2017 | Drader et al. |
| 2017/0176577 A1 | 6/2017 | Halliday |
| 2017/0176579 A1* | 6/2017 | Niclass .................. G01S 17/10 |
| 2017/0179173 A1 | 6/2017 | Mandai et al. |
| 2017/0184450 A1 | 6/2017 | Doylend et al. |
| 2017/0184704 A1 | 6/2017 | Yang et al. |
| 2017/0184709 A1 | 6/2017 | Kenzler et al. |
| 2017/0188016 A1 | 6/2017 | Hudman |
| 2017/0219695 A1 | 8/2017 | Hall et al. |
| 2017/0242102 A1 | 8/2017 | Dussan et al. |
| 2017/0242108 A1 | 8/2017 | Dussan et al. |
| 2017/0257617 A1 | 9/2017 | Retterath |
| 2017/0269209 A1 | 9/2017 | Hall et al. |
| 2017/0303789 A1 | 10/2017 | Tichauer et al. |
| 2017/0329010 A1 | 11/2017 | Warke et al. |
| 2017/0343675 A1 | 11/2017 | Oggier et al. |
| 2017/0356796 A1 | 12/2017 | Nishio |
| 2017/0356981 A1 | 12/2017 | Yang et al. |
| 2018/0045816 A1 | 2/2018 | Jarosinski et al. |
| 2018/0059220 A1 | 3/2018 | Irish et al. |
| 2018/0062345 A1 | 3/2018 | Bills et al. |
| 2018/0081030 A1 | 3/2018 | McMahon et al. |
| 2018/0081032 A1 | 3/2018 | Torruellas et al. |
| 2018/0081041 A1 | 3/2018 | Niclass et al. |
| 2018/0115762 A1 | 4/2018 | Bulteel et al. |
| 2018/0131449 A1 | 5/2018 | Kare et al. |
| 2018/0167602 A1 | 6/2018 | Pacala et al. |
| 2018/0203247 A1 | 7/2018 | Chen et al. |
| 2018/0205943 A1 | 7/2018 | Trail |
| 2018/0209846 A1 | 7/2018 | Mandai et al. |
| 2018/0259645 A1 | 9/2018 | Shu et al. |
| 2018/0299554 A1 | 10/2018 | Van Dyck et al. |
| 2018/0341009 A1 | 11/2018 | Niclass et al. |
| 2019/0004156 A1 | 1/2019 | Niclass et al. |
| 2019/0011556 A1 | 1/2019 | Pacala et al. |
| 2019/0011567 A1 | 1/2019 | Pacala et al. |
| 2019/0018117 A1 | 1/2019 | Perenzoni et al. |
| 2019/0018118 A1 | 1/2019 | Perenzoni et al. |
| 2019/0018119 A1 | 1/2019 | Laifenfeld et al. |
| 2019/0018143 A1 | 1/2019 | Thayer et al. |
| 2019/0037120 A1 | 1/2019 | Ohki |
| 2019/0056497 A1 | 2/2019 | Pacala et al. |
| 2019/0094364 A1 | 3/2019 | Fine et al. |
| 2019/0170855 A1 | 6/2019 | Keller et al. |
| 2019/0178995 A1 | 6/2019 | Tsai et al. |
| 2019/0257950 A1 | 8/2019 | Patanwala et al. |
| 2019/0277952 A1 | 9/2019 | Beuschel et al. |
| 2019/0361404 A1 | 11/2019 | Mautner et al. |
| 2020/0142033 A1 | 5/2020 | Shand |
| 2020/0233068 A1 | 7/2020 | Henderson et al. |
| 2020/0249324 A1 | 8/2020 | Steinberg et al. |
| 2020/0314294 A1 | 10/2020 | Schoenlieb et al. |
| 2022/0146647 A1 | 5/2022 | Sakazume |

FOREIGN PATENT DOCUMENTS

| | | |
|---|---|---|
| CN | 101401107 A | 4/2009 |
| CN | 103763485 A | 4/2014 |
| CN | 103983979 A | 8/2014 |
| CN | 104730535 A | 6/2015 |
| CN | 104914446 A | 9/2015 |
| CN | 105992960 A | 10/2016 |
| CN | 106405572 A | 2/2017 |
| CN | 110609293 A | 12/2019 |
| DE | 202013101039 U1 | 3/2014 |
| DE | 102015013710 A1 | 4/2017 |
| EP | 2157445 A2 | 2/2010 |
| EP | 2322953 A1 | 5/2011 |
| EP | 2469297 A1 | 6/2012 |
| EP | 2477043 A1 | 7/2012 |
| EP | 2827175 A2 | 1/2015 |
| EP | 3285087 A1 | 2/2018 |
| EP | 3318895 A1 | 5/2018 |
| EP | 3370080 A1 | 9/2018 |
| EP | 3521856 A1 | 8/2019 |
| JP | H02287113 A | 11/1990 |
| JP | H0567195 A | 3/1993 |
| JP | 09197045 A | 7/1997 |
| JP | H10170637 A | 6/1998 |
| JP | H11063920 A | 3/1999 |
| JP | 2011089874 A | 5/2011 |
| JP | 2011237215 A | 11/2011 |
| JP | 2013113669 A | 6/2013 |
| JP | 2014059301 A | 4/2014 |
| JP | 2020197457 A | 12/2020 |
| JP | 7383558 B2 | 11/2023 |
| KR | 101318951 B1 | 10/2013 |
| TW | 202343020 A | 11/2023 |
| WO | 9008946 A1 | 8/1990 |
| WO | 2007144565 A2 | 12/2007 |
| WO | 2010149593 A1 | 12/2010 |
| WO | 2012154356 A1 | 11/2012 |
| WO | 2013028691 A1 | 2/2013 |
| WO | 2015199615 A1 | 12/2015 |
| WO | 2016034408 A1 | 3/2016 |
| WO | 2017106875 A1 | 6/2017 |
| WO | 2018122560 A1 | 7/2018 |
| WO | 2020101576 A1 | 5/2020 |
| WO | 2020109378 A1 | 6/2020 |
| WO | 2020201452 A1 | 10/2020 |
| WO | 2022244322 A1 | 11/2022 |

OTHER PUBLICATIONS

U.S. Appl. No. 15/950,186 office action dated Jun. 23, 2020.
International Application # PCT/US2020/058760 Search Report dated Feb. 9, 2021.
TW Application # 109119267 Office Action dated Mar. 10, 2021.
U.S. Appl. No. 16/752,653 Office Action dated Apr. 5, 2021.
Charbon et al., "SPAD-Based Sensors", TOF Range-Imaging Cameras, Springer-Verlag, pp. 11-38, year 2013.
Niclass et al., "A 0.18 um CMOS SoC for a 100m range, 10 fps 200×96 pixel Time of Flight depth sensor", IEEE International Solid- State Circuits Conference- (ISSCC), Session 27, Image Sensors, 27.6, pp. 488-490, Feb. 20, 2013.
Walker et al., "A 128×96 pixel event-driven phase-domain ΔΣ-based fully digital 3D camera in 0.13μm CMOS imaging technology", IEEE International Solid- State Circuits Conference—(ISSCC), Session 23, Image Sensors, 23.6, pp. 410-412, Feb. 23, 2011.
Niclass et al., "Design and characterization of a 256×64-pixel single-photon imager in CMOS for a MEMS-based laser scanning time-of-flight sensor", Optics Express, vol. 20, issue 11, pp. 11863-11881, May 21, 2012.
Kota et al., "System Design and Performance Characterization of a MEMS-Based Laser Scanning Time-of-Flight Sensor Based on a 256 × 64-pixel Single-Photon Imager", IEEE Photonics Journal, vol. 5, issue 2, pp. 1-15, Apr. 2013.
Webster et al., "A silicon photomultiplier with >30% detection efficiency from 450-750nm and 11.6μm pitch NMOS-only pixel with 21.6% fill factor in 130nm CMOS", Proceedings of the European Solid-State Device Research Conference (ESSDERC), pp. 238-241, Sep. 7-21, 2012.
Roth et al., U.S. Appl. No. 16/532,517, filed Aug. 6, 2019.
Buttgen et al., "Pseudonoise Optical Modulation for Real-Time 3-D Imaging With Minimum Interference", IEEE Transactions on Circuits and Systems I: Regular Papers, vol. 54, Issue10, pp. 2109-2119, Oct. 1, 2007.
Bradski et al., "Learning OpenCV", first edition, pp. 1-50, O'Reilly Media, Inc, California, USA, year 2008.
CN Application # 201680074428.8 Office Action dated Jun. 23, 2021.
Zhu Jian, "Research of Simulation of Super-Resolution Reconstruction of Infrared Image", abstract page, Master's Thesis, p. 1, Nov. 15, 2005.
U.S. Appl. No. 15/586,286 office action dated Dec. 2, 2019.
International Application # PCT/US2019/45187 search report dated Nov. 15, 2019.
U.S. Appl. No. 16/752,653 Office Action dated Oct. 1, 2021.
EP Application # 17737420.4 Office Action dated Oct. 28, 2021.

(56) References Cited

OTHER PUBLICATIONS

KR Application # 1020200068248 Office Action dated Nov. 12, 2021.
KR Application # 1020207015906 Office Action dated Oct. 13, 2021.
JP Application # 2020001203 Office Action dated Feb. 4, 2021.
U.S. Appl. No. 16/752,653 Office Action dated Feb. 4, 2021.
Morbi et al., "Short range spectral lidar using mid-infrared semiconductor laser with code-division multiplexing technique", Technical Digest, CLEO 2001, pp. 491-492 pages, May 2001.
Al et al., "High-resolution random-modulation cw lidar", Applied Optics, vol. 50, issue 22, pp. 4478-4488, Jul. 28, 2011.
Chung et al., "Optical orthogonal codes: design, analysis and applications", IEEE Transactions on Information Theory, vol. 35, issue 3, pp. 595-604, May 1989.
Lin et al., "Chaotic lidar", IEEE Journal of Selected Topics in Quantum Electronics, vol. 10, issue 5, pp. 991-997, Sep.-Oct. 2004.
CN Utility Model Patent # 201520865151.7 UMPER report dated Oct. 9, 2019.
International application PCT/US2019/45188 Search report dated Oct. 21, 2019.
EP Application No. 20177707 Search Report dated Sep. 29, 2020.
U.S. Appl. No. 15/586,286 office action dated Feb. 24, 2020.
U.S. Appl. No. 16/532,517 Office Action dated Oct. 14, 2020.
EP Application # 20177707.5 Search Report dated Nov. 12, 2020.
U.S. Appl. No. 16/679,360 Office Action dated Jun. 29, 2022.
EP Application # 22167103.5 Search Report dated Jul. 11, 2022.
CN Application # 201780058088.4 Office Action dated Aug. 23, 2022.
U.S. Appl. No. 16/885,316 Office Action dated Jun. 30, 2022.
IN Application # 202117029897 Office Action dated Mar. 10, 2022.
IN Application # 202117028974 Office Action dated Mar. 2, 2022.
CN Application # 201810571820.4 Office Action dated Sep. 9, 2022.
KR Application # 1020220101419 Office Action dated Sep. 28, 2022.
U.S. Appl. No. 17/026,365 Office Action dated Nov. 7, 2022.
U.S. Appl. No. 17/079,548 Office Action dated Mar. 3, 2023.
CN Application # 201780097602.5 Office Action dated Mar. 15, 2023.
CN Application # 202010063812.6 Office Action dated Mar. 18, 2023.
KR Application # 1020217025136 Office Action dated Apr. 4, 2023.
U.S. Appl. No. 17/026,365 Office Action dated Jan. 26, 2023.
Zhu et al., "Measurement Method for Real-Time Transmission of Optical Signal Based on Single Photon Detection," Chinese Journal of Lasers, vol. 43, No. 2, pp. 1-6, year 2016.
Yang, "The Study of Phase-Demodulation Range-Finding Techniques Based o SPAD," Chinese Master's Thesis Full-text Database, Engineering Science and Technology, Xiangtan University, pp. 1-63, May 2016.
Zhang, "Structured Light Based Fast and High Accuracy Depth Sensing," China Doctoral Dissertations Full-text Database, Information Science and Technology, University of Science and Technology of China, pp. 1-110, Apr. 2015.
Ionescu et al., "A 3D NIR Camera for Gesture Control of Video Game Consoles," Conference Paper, 2014 IEEE International Conference on Computational Intelligence and Virtual Environments for Measurement Systems and Applications (CIVEMSA), pp. 1-5, year 2014.
U.S. Appl. No. 16/769,346 Office Action dated Aug. 3, 2023.
CN Application # 202010063812.6 Office Action dated Aug. 1, 2023.
CN Application # 201980090098.5 Office Action dated Dec. 4, 2023.
IN Application # 202117028974 Summons to Hearing dated Dec. 8, 2023.
CN Application # 202010521767.4 Office Action dated Dec. 8, 2023.
CN Application # 201980090030.7 Office Action dated Jan. 5, 2024.
U.S. Appl. No. 17/189,300 Office Action dated Jun. 4, 2024.

\* cited by examiner

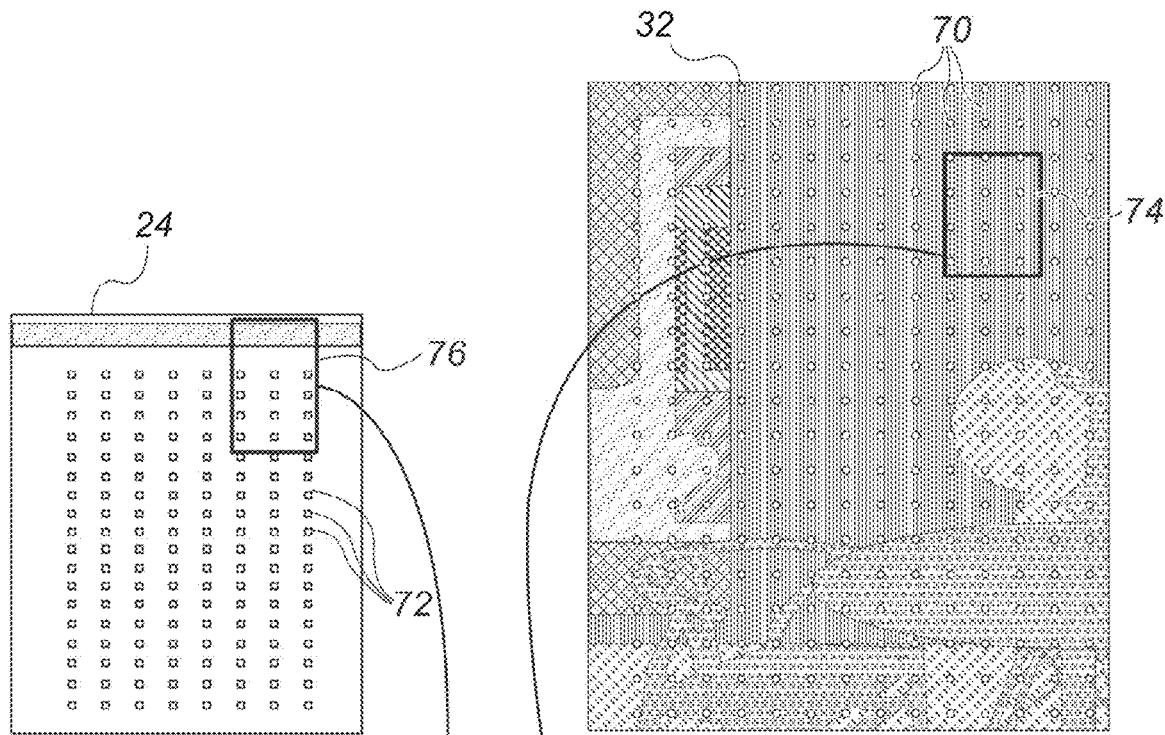
FIG. 3B
FIG. 3A
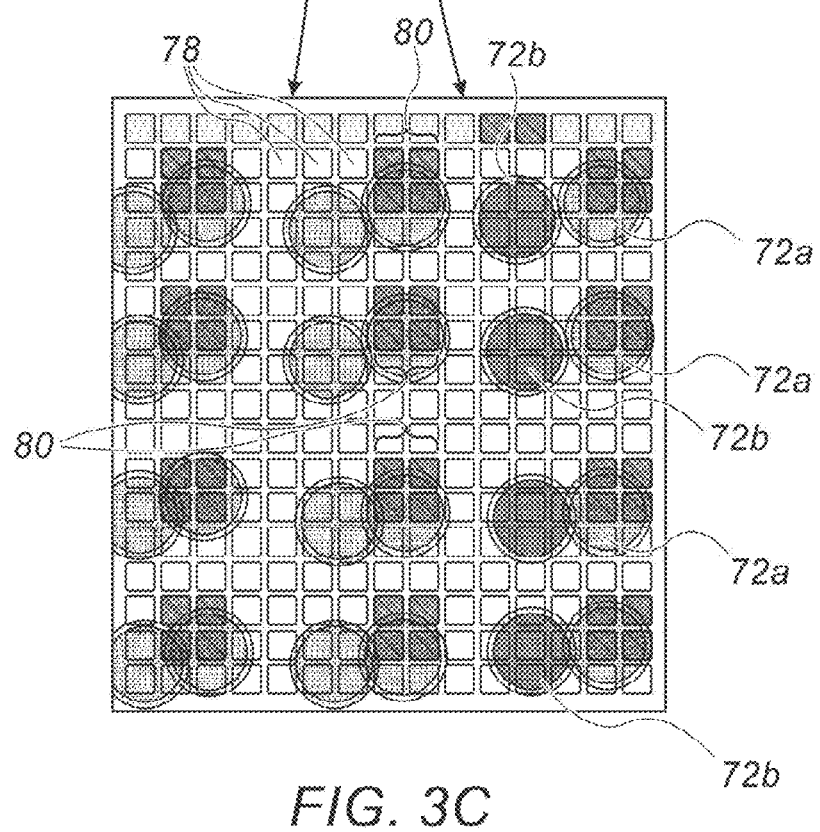
FIG. 3C

DEPTH SENSING USING A SPARSE ARRAY OF PULSED BEAMS

CROSS-REFERENCE TO RELATED APPLICATIONS

This application claims the benefit of U.S. Provisional Patent Application 62/803,612, filed Feb. 11, 2019, and U.S. Provisional Patent Application 62/809,647, filed Feb. 24, 2019. This application is related to U.S. patent application Ser. No. 16/532,527, filed Aug. 6, 2019 (now U.S. Pat. No. 10,955,234), entitled "Calibration of depth sensing using a sparse array of pulsed beams". All of these related applications are incorporated herein by reference.

FIELD OF THE INVENTION

The present invention relates generally to systems and methods for depth mapping, and particularly to beam sources and sensor arrays used in time-of-flight sensing.

BACKGROUND

Existing and emerging consumer applications have created an increasing need for real-time three-dimensional (3D) imagers. These imaging devices, also known as depth sensors, depth mappers, or light detection and ranging (LiDAR) sensors, enable the remote measurement of distance (and often intensity) to each point in a target scene—referred to as target scene depth—by illuminating the target scene with an optical beam and analyzing the reflected optical signal. A commonly-used technique to determine the distance to each point on the target scene involves transmitting one or more pulsed optical beams towards the target scene, followed by the measurement of the round-trip time, i.e. time-of-flight (ToF), taken by the optical beams as they travel from the source to the target scene and back to a detector array adjacent to the source.

Some ToF systems use single-photon avalanche diodes (SPADs), also known as Geiger-mode avalanche photodiodes (GAPDs), in measuring photon arrival time. For example, U.S. Pat. No. 9,997,551, whose disclosure is incorporated herein by reference, describes a sensing device that includes an array of SPAD sensing elements. Each sensing element includes a photodiode, including a p-n junction, and a local biasing circuit, which is coupled to reverse-bias the p-n junction at a bias voltage greater than the breakdown voltage of the p-n junction by a margin sufficient so that a single photon incident on the p-n junction triggers an avalanche pulse output from the sensing element. A bias control circuit is coupled to set the bias voltage in different ones of the sensing elements to different, respective values.

U.S. Patent Application Publication 2017/0176579, whose disclosure is incorporated herein by reference, describes the use of this sort of variable biasing capability in selectively actuating individual sensing elements or groups of sensing elements in a SPAD array. For this purpose, an electro-optical device includes a laser light source, which emits at least one beam of light pulses, a beam steering device, which transmits and scans the at least one beam across a target scene, and an array of sensing elements. Each sensing element outputs a signal indicative of a time of incidence of a single photon on the sensing element. (Each sensing element in such an array is also referred to as a "pixel.") Light collection optics image the target scene scanned by the transmitted beam onto the array. Circuitry is coupled to actuate the sensing elements only in a selected region of the array and to sweep the selected region over the array in synchronization with scanning of the at least one beam.

SUMMARY

Embodiments of the present invention that are described hereinbelow provide improved depth mapping systems and methods for operating such systems.

There is therefore provided, in accordance with an embodiment of the invention, depth sensing apparatus, including a radiation source, which includes a first array of emitters arranged in multiple banks, which are configured to emit a first plurality of pulsed beams of optical radiation toward a target scene. A second plurality of sensing elements are arranged in a second array and are configured to output signals indicative of respective times of incidence of photons on the sensing elements, wherein the second plurality exceeds the first plurality. Objective optics are configured to form an image of the target scene on the array of sensing elements. Processing and control circuitry is coupled to actuate the multiple banks in alternation to emit the pulsed beams and is coupled to receive the signals from the sensing elements, and is configured to identify, responsively to the signals, areas of the second array on which the pulses of optical radiation reflected from corresponding regions of the target scene are incident, and to process the signals from the sensing elements in the identified areas in order measure depth coordinates of the corresponding regions of the target scene based on the times of incidence.

In a disclosed embodiment, the emitters in the array include vertical-cavity surface-emitting lasers (VCSELs).

In some embodiments, the multiple banks include at least four banks, each bank containing at least four of the emitters. In one embodiment, the radiation source includes a diffractive optical element (DOE) which is configured to split the optical radiation emitted by each of the emitters into multiple ones of the pulsed beams. Additionally or alternatively, the at least four banks include at least eight banks. Each bank may contain at least twenty of the emitters. In a disclosed embodiment, the banks of emitters are interleaved on a substrate.

Additionally or alternatively, the sensing elements include single-photon avalanche diodes (SPADs).

In some embodiments, the processing and control circuitry is configured to group the sensing elements in each of the identified areas together to define super-pixels, and to process together the signals from the sensing elements in each of the super-pixels in order to measure the depth coordinates. In a disclosed embodiment, the processing and control circuitry includes multiple processing units, wherein each of the processing units is coupled to process the signals from a respective one of the super-pixels. Additionally or alternatively, each of the processing units is configured to construct a histogram of the times of incidence of the photons on the sensing elements in each of the super-pixels.

In some embodiments, the pulses of the optical radiation emitted from the multiple banks of the emitters are incident, after reflection from the target scene, on different, respective sets of the identified areas of the second array, and the processing and control circuitry is configured to receive and process the signals from the sensing elements in the respective sets in synchronization with actuation of the multiple banks. In the disclosed embodiments, when any given bank of the emitters is actuated, the processing and control circuitry is configured to read and process the signals only from the sensing elements in a corresponding set of the identified areas of the second array, while the remaining sensing elements in the array are inactive.

There is also provided, in accordance with an embodiment of the invention, a method for depth sensing, which includes driving a first array of emitters arranged in multiple banks to emit a first plurality of pulsed beams of optical radiation toward a target scene, while actuating the multiple banks in alternation to emit the pulsed beams. An image of the target scene is formed on a second plurality of sensing elements, which are arranged in a second array and are configured to output signals indicative of respective times of incidence of photons on the sensing elements, wherein the second plurality exceeds the first plurality. Responsively to the signals from the sensing elements, areas of the second array are identified on which the pulses of optical radiation reflected from corresponding regions of the target scene are incident. The signals from the sensing elements in the identified areas are processed in order measure depth coordinates of the corresponding regions of the target scene based on the times of incidence.

The present invention will be more fully understood from the following detailed description of the embodiments thereof, taken together with the drawings in which:

BRIEF DESCRIPTION OF THE DRAWINGS

FIG. 3A is a schematic representation of a pattern of spots projected onto a target scene, in accordance with an embodiment of the invention;

FIG. 3B is a schematic frontal view of a ToF sensing array, in accordance with an embodiment of the invention;

FIG. 3C is a schematic detail view of a part of the ToF sensing array of FIG. 3B, onto which images of the spots in a region of the target scene of FIG. 3A are cast, in accordance with an embodiment of the invention;

DETAILED DESCRIPTION OF EMBODIMENTS

Overview

Figure 1:
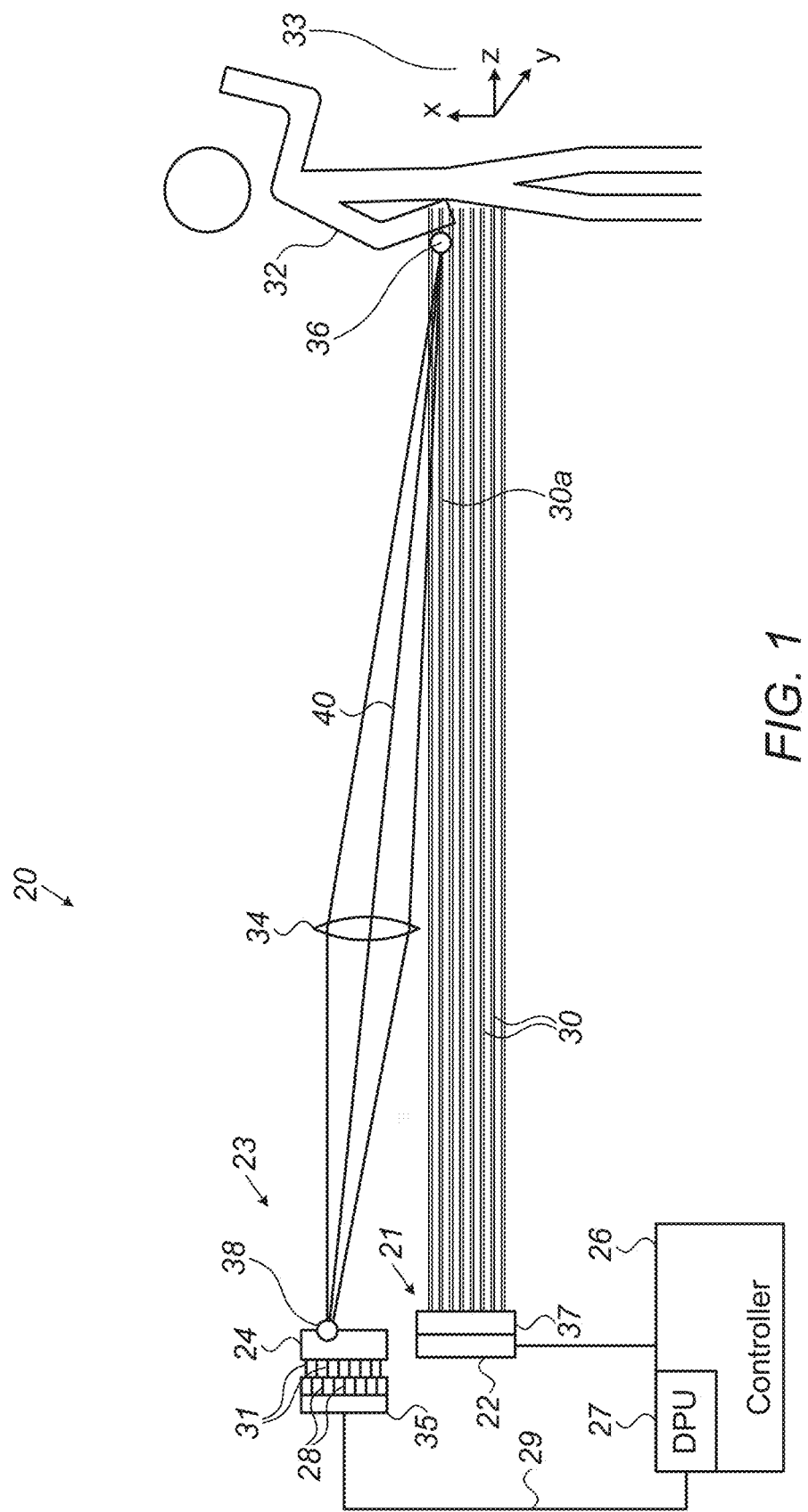
FIG. 1 is a schematic side view of a depth mapping system, in accordance with an embodiment of the invention.

In some of the embodiments described in the above-mentioned U.S. Patent Application Publication 2017/0176579, SPADs are grouped together into "super-pixels," wherein the term "super-pixel" refers to a group of mutually-adjacent pixels along with data processing elements that are coupled directly to these pixels. At any instant during operation of the system, only the sensing elements in the area or areas of the array that are to receive reflected illumination from a beam are actuated, for example by appropriate biasing of the SPADs in selected super-pixels, while the remaining sensing elements are inactive. The sensing elements are thus actuated only when their signals provide useful information. This approach reduces the background signal, thus enhancing the signal-to-background ratio, and lowers both the electrical power needs of the detector array and the number of data processing units that must be attached to the SPAD array.

One issue to be resolved in a depth mapping system of this sort is the sizes and locations of the super-pixels to be used. For accurate depth mapping, with high signal/background ratio, it is important that the super-pixels contain the detector elements onto which most of the energy of the reflected beams is imaged, while the sensing elements that do not receive reflected beams remain inactive. Even when a static array of emitters is used, however, the locations of the reflected beams on the detector array can change, for example due to thermal and mechanical changes over time, as well as optical effects, such as parallax.

In response to this problem, some embodiments of the present invention provide methods for calibrating the locations of the laser spots on the SPAD array. For this purpose, processing and control circuitry receives timing signals from the array and searches over the sensing elements in order to identify the respective regions of the array on which the light pulses reflected from the target scene are incident. Detailed knowledge of the depth mapping system may be used in order to pre-compute likely regions of the reflected laser spots to be imaged onto the SPAD array. A random search in these regions will converge rapidly to the correct locations of the laser spots on the array. Alternatively or additionally, a small subset of the locations of laser spots can be identified in an initialization stage. These locations can be used in subsequent iterative stages to predict and verify the positions of further laser spots until a sufficient number of laser spots have been located.

Even following meticulous calibration, it can occur in operation of the depth mapping system that some of the pixels or super-pixels on which laser spots are expected to be imaged fail to output usable timing signals. In some cases, ancillary image data can be used to identify areas of the scene that are problematic in terms of depth mapping, and to recalibrate the super-pixel locations when necessary. This ancillary image data can be provided, for example, by a color image sensor, which captures two-dimensional (2D) images in registration with the SPAD array.

The emitter arrays used in the embodiments described below are "sparse," in the sense that the number of pulsed beams of optical radiation that are emitted toward a target scene is substantially less than the number of pixels (i.e., SPADs or other sensing elements) in the array that receives the radiation reflected from the scene. The illumination power available from the emitter array is projected onto a correspondingly sparse grid of spots in the scene. The processing and control circuitry in the apparatus then receives and processes signals only from the pixels onto which these spots are imaged in order to measure depth coordinates.

The pixels onto which the spots are imaged are referred to herein as the "active pixels," and the "super-pixels" are made up of groups of adjacent active pixels, for example 2×2 groups. The pixels in the array that fall between the active pixels are ignored, and need not be actuated or read out at all, as they do not contribute to the depth measurement and only increase the background level and noise. Alternatively, a different number, such as one, two, three or more pixels, may be included in a super-pixel. Furthermore, although the embodiments described herein relate specifically to rectangular super-pixels, the group of SPAD pixels in a super-pixel may have a different shape, such as, for example, diamond shape, triangular, circular, or irregular. The exact location of the spot within the SPAD pixels varies slightly depending on the distance to the scene due to a small amount of parallax. At any given time, the signals from the SPAD pixels of the super-pixel are processed together in measuring for a given laser spot both its strength (intensity) and its time of flight. Additionally, the signals from the SPAD pixels may be processed as individual signals for determining the location of the laser spot within the super-pixel.

An advantage of using a sparse emitter array is that the available power budget can be concentrated in the small number of projected spots, rather than being spread over the entire field of view of the sensing array. As a result of this concentration of optical power in a small number of spots, the signal levels from the corresponding active pixels—and thus the accuracy of ToF measurement by these pixels—are enhanced. This signal enhancement is particularly beneficial for long-range depth measurements and for depth mapping in conditions of strong ambient light, such as outdoors.

The concentration of optical power in a sparse array of spots can be further enhanced by arranging the emitters in multiple banks, and actuating these banks in alternation. The laser beams generated by the emitters are typically collimated by a collimating lens and may be replicated by a diffractive optical element (DOE) in order to increase the number of projected spots. The pulses of optical radiation emitted from the different banks of the emitters are incident, after reflection from the target scene, on different, respective sets of the active pixels. The processing and control circuitry can then receive and process the signals from the active pixels in these respective sets in synchronization with actuation of the corresponding banks of emitters. Thus, during any given period in the operation of the apparatus, the processing and control circuitry need receive and process the signals only from one active set of sensing elements, while all other sets remain inactive. This sort of multi-bank, synchronized operation makes it possible to time-multiplex processing resources among the different sets of sensing elements, and thus reduce circuit complexity and power consumption.

Because the spots reflected from the target scene are imaged sparsely onto the SPAD array, the number of possible super-pixels is much larger than the number of laser spots, and only a small fraction of the total number of pixels in the SPAD array should be active at any given time and coupled to a processing unit for the purpose of measuring time-of-flight. Therefore, information is required as to which of the SPAD super-pixels to activate at any given time.

A mapping of SPAD pixels to processing units, i.e., the assignment of SPAD pixels to super-pixels, may be determined initially during a factory calibration.

However, temperature changes during operation, as well as mechanical shocks, may alter the mechanical parameters of the mapping, thus modifying the positions of the laser spots on the SPAD array and necessitating recalibration during operation in the field. An exhaustive search could be used to determine which of the SPAD pixels to connect to the processing units, wherein all pixels are searched to detect laser spots; but this approach suffers from at least two basic problems:

Some laser spots may not fall on objects in the scene or may fall on objects that absorb the laser wavelength, thus returning no pulse. Therefore a search may not always be successful.

As the distribution of laser spots is very sparse when compared to the number of pixels of the SPAD array, exhaustive search will require a large number of exposures and will take a long time.

The embodiments of the present invention that are described herein address these problems by providing improved methods for calibrating the locations of the laser spots on the SPAD array. These methods can be applied not only in the sorts of arrays that are shown in the figures and described hereinbelow, but also in other SPAD-based systems, such as systems comprising multiple banks of SPADs, as well as SPADs of various sizes, and systems using various sorts of emitters and emitter arrays, including emitters whose beams are replicated by a DOE. The present methods can then be extended, mutatis mutandis, to multi-bank systems, by activating the SPAD pixels and performing the calibration bank by bank.

In a disclosed embodiment, detailed knowledge of the depth mapping system is utilized to pre-compute likely regions of the reflected laser spots to be imaged onto the SPAD array. A search in these regions, for example a random search, will converge rapidly to the correct locations of the laser spots on the array.

Another disclosed embodiment uses a two-stage solution: in an initialization stage, a small subset of the locations of laser spots is identified, and in a subsequent iterative stage, the positions of further laser spots are predicted by a model and verified. Iterative steps of spot detection are utilized to refine the model and add locations, until a sufficient number of laser spots have been located.

System Description

FIG. 1 is a schematic side view of a depth mapping system 20, in accordance with an embodiment of the invention. Depth mapping system 20 comprises a radiation source 21, which emits M individual beams (for example, M may be on the order of 500). The radiation source comprises multiple banks of emitters arranged in a two-dimensional array 22 (as shown in detail in FIG. 2B), together with beam optics 37. The emitters typically comprises solid-state devices, such as vertical-cavity surface-emission lasers (VCSELs) or other sorts of lasers or light-emitting diodes (LEDs). The beam optics typically comprise a collimating lens and may comprise a diffractive optical element (DOE, not shown), which replicates the actual beams emitted by array 22 to create the M beams that are projected onto the scene 32. (For example, an array of four banks of pixels with 16 VCSELs in a 4×4 arrangement in each bank may be used to create 8×8 beams, and a DOE may split each beam into 3×3 replicas to give a total of 24×24 beams.) For the sake of simplicity, these internal elements of beam optics 37 are not shown.

A receiver 23 in system 20 comprises a two-dimensional SPAD array 24, together with J processing units 28 and select lines 31 for coupling the processing units to the SPADs, along with a combining unit 35 and a controller 26. SPAD array 24 comprises a number of detector elements N that is much larger than M, for example, 100×100 pixels or 200×200 pixels. The number J of processing units 28 depends on the number of pixels of SPAD array 24 to which each processing unit is coupled, as will be further described with reference to FIG. 4.

Array 22, together with beam optics 37, emits M pulsed beams of light 30 towards a target scene 32. Although beams 30 are depicted in FIG. 1 as parallel beams of constant width, each beam diverges as dictated by diffraction. Furthermore, beams 30 diverge from each other so as to cover a required area of scene 32. Scene 32 reflects or otherwise scatters those beams 30 that impinge on the scene. The reflected and scattered beams are collected by objective optics 34, represented by a lens in FIG. 1, which form an image of scene 32 on array 24. Thus, for example, a small region 36 on scene 32, on which a beam 30a has impinged, is imaged onto a small area 38 on SPAD array 24.

A Cartesian coordinate system 33 defines the orientation of depth mapping system 20 and scene 32. The x-axis and the y-axis are oriented in the plane of SPAD array 24. The z-axis is perpendicular to the array and points to scene 32 that is imaged onto SPAD array 24.

For clarity, processing units 28 are shown as if separate from SPAD array 24, but they are commonly integrated with the SPAD array. Similarly, combining unit 35 is commonly integrated with SPAD array 24. Processing units 28, together with combining unit 35, comprise hardware amplification and logic circuits, which sense and record pulses output by the SPADs in respective super-pixels, and thus measure the times of arrival of the photons that gave rise to the pulses, as well as the strengths of the optical pulses impinging on SPAD array 24.

As further described below in reference to FIG. 4, processing units 28 together with combining unit 35 may assemble histograms of the times of arrival of multiple pulses emitted by array 22, and thus output signals that are indicative of the distance to respective points in scene 32, as well as of signal strength. Circuitry that can be used for this purpose is described, for example, in the above-mentioned U.S. Patent Application Publication 2017/0176579. Alternatively or additionally, some or all of the components of processing units 28 and combining unit 35 may be separate from SPAD array 24 and may, for example, be integrated with controller 26. For the sake of generality, controller 26, processing units 28 and combining unit 35 are collectively referred to herein as "processing and control circuitry."

Controller 26 is coupled to both radiation source 21 and receiver 23. Controller 26 actuates the banks of emitters in array 22 in alternation to emit the pulsed beams. The controller also provides to the processing and combining units in receiver 23 an external control signal 29, and receives output signals from the processing and combining units. The output signals may comprise histogram data, and may be used by controller 26 to derive both times of incidence and signal strengths, as well as a precise location of each laser spot that is imaged onto SPAD array 24.

To make optimal use of the available sensing and processing resources, controller 26 identifies the respective areas of SPAD array 24 on which the pulses of optical radiation reflected from corresponding regions of target scene 32 are imaged by lens 34, and chooses the super-pixels to correspond to these areas. The signals output by sensing elements outside these areas are not used, and these sensing elements may thus be deactivated, for example by reducing or turning off the bias voltage to these sensing elements. Methods for choosing the super-pixels initially and for verifying and updating the selection of super-pixels are described, for example, in the above-mentioned provisional patent applications.

External control signal 29 controls select lines 31 so that each processing unit 28 is coupled to a respective super-pixel, comprising four SPAD pixels, for example. The control signal selects the super-pixels from which the output signals are to be received in synchronization with the actuation of the corresponding banks of emitters. Thus, at any given time, processing units 28 and combining unit 35 read and process the signals only from the sensing elements in the areas of SPAD array 24 that receive the reflected pulses from scene 32, while the remaining sensing elements in the array are inactive. The processing of the signals from SPAD array 24 is further described in reference to FIG. 4. For the sake of simplicity, the detailed structures of emitter array 22 and SPAD array 24 are not shown in FIG. 1.

For clarity, the dimensions of emitter array 22 and SPAD array 24 have been exaggerated in FIG. 1 relative to scene 32. The lateral separation of emitter array 22 and SPAD array 24, referred to as the "baseline," is in reality much smaller than the distance from emitter array 22 to scene 32. Consequently a chief ray 40 (a ray passing through the center of objective optics 34) from scene 32 to SPAD array 24 is nearly parallel to rays 30, leading to only a small amount of parallax.

Of those M super-pixels that are activated and coupled to the J processing units 28, either all of them or a subset of m super-pixels, wherein $m \leq M$, will receive a reflected laser beam 30. The magnitude of m depends on two factors:
1. The calibration of SPAD array 24, i.e., the choice of the M super-pixels, and
2. The number of laser beams 30 that are actually reflected from scene 32.

The value M may correspond to the total number of emitters when all of the emitters are actuated together, or to the number of emitters in each bank when the banks are actuated in alternation, as in the present embodiments.

Even if all M laser beams 30 were to be reflected from scene 32, m will be less than M if SPAD array 24 is not properly calibrated. (Calibration procedures described in the above-mentioned provisional patent applications can be used to maximize m.) Consequently, controller 26 will receive signals indicating times of arrival and signal strengths from only m processing units 28. Controller 26 calculates from the timing of the emission of beams 30 by VCSEL array 22 and from the times of arrival measured by the m processing units 28 the time-of-flight of the m beams, and thus maps the distance to the corresponding m points on scene 32.

Controller 26 typically comprises a programmable processor, which is programmed in software and/or firmware to carry out the functions that are described herein. Alternatively or additionally, controller 26 comprises hard-wired and/or programmable hardware logic circuits, which carry out at least some of the functions of the controller. Although controller 26 is shown in the figure, for the sake of simplicity, as a single, monolithic functional block, in practice the controller may comprise a single chip or a set of two or more chips, with suitable interfaces for receiving and outputting the signals that are illustrated in the figure and are described in the text.

One of the functional units of controller 26 is a depth processing unit (DPU) 27, which processes signals from both processing units 28 and combining unit 35, as will be further described below. DPU 27 calculates the times of flight of the photons in each of beams 30, and thus maps the distance to the corresponding points in target scene 32. This mapping is based on the timing of the emission of beams 30 by emitter array 22 and from the times of arrival (i.e., times of incidence of reflected photons) measured by processing units 28. Controller 26 typically stores the depth coordinates in a memory, and may output the corresponding depth map for display and/or further processing.

Emitter Array

Figure 2A:
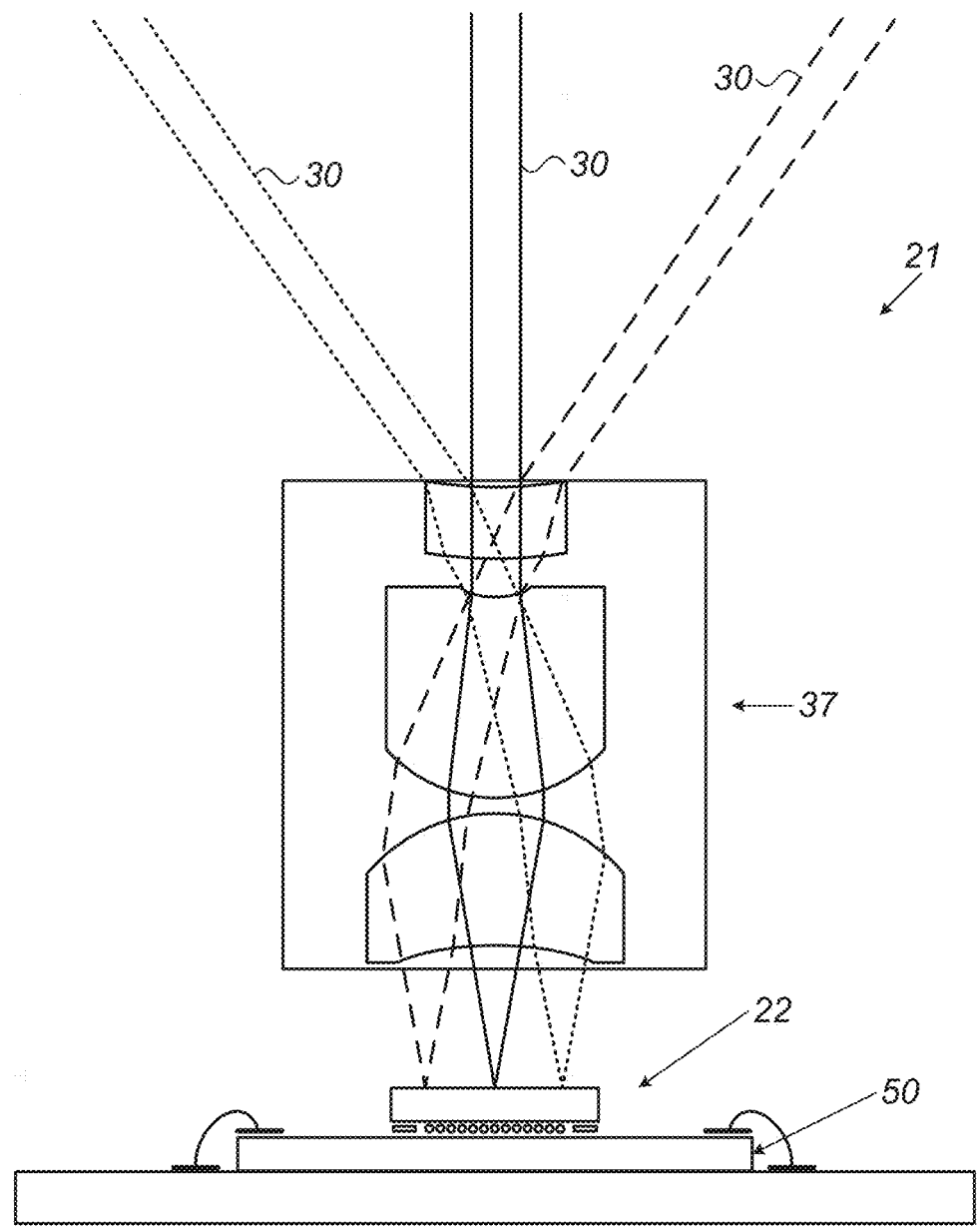
FIG. 2A is a schematic side view of a radiation source used in the depth mapping system of FIG. 1, in accordance with an embodiment of the invention.
Figure 2B:
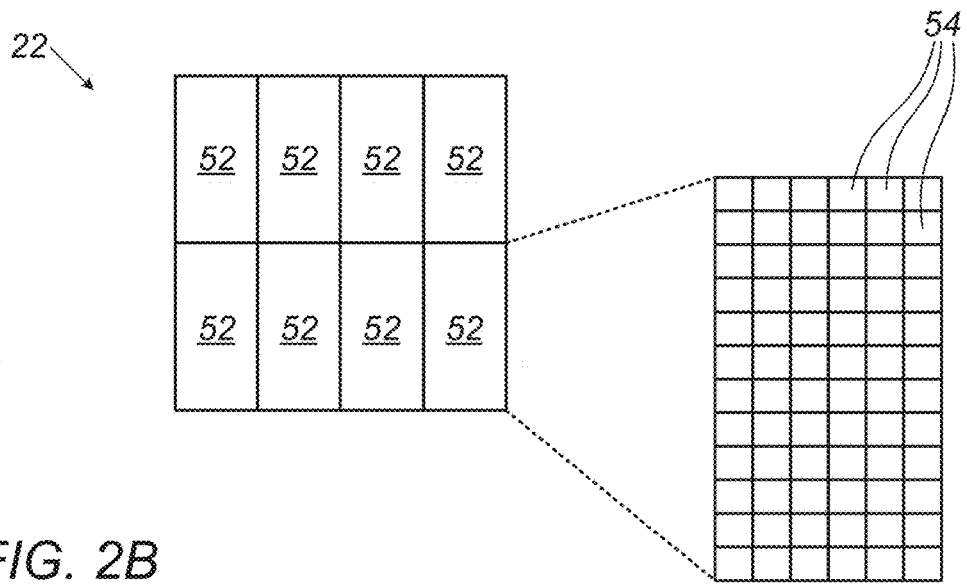
FIG. 2B is a schematic frontal view of an array of emitters used in the radiation source of FIG. 2A, in accordance with an embodiment of the invention.

FIG. 2A is a schematic side view of radiation source 21, in accordance with an embodiment of the invention. VCSEL array 22 comprises an integrated circuit chip on which multiple banks of VCSELs are formed (as shown in FIG. 2B, for example). The VCSELs emit respective beams 30 toward optics 37, which collimate and project the beams toward the target scene. Optics 37 optionally comprise a diffractive optical element (DOE), which splits the optical radiation emitted by each of the VCSELs into multiple beams 30, for example a 3×3 array of beams.

To enable selection and switching among the different banks, array 22 is mounted on a driver chip 50, for example, a silicon chip with CMOS circuits for selecting and driving the individual VCSELs or banks of VCSELs. The banks of VCSELS in this case may be physically separated, for ease of fabrication and control, or they may be interleaved on the VCSEL chip, with suitable connections to driver chip 50 to enable actuating the banks in alternation. Thus, beams 30 likewise irradiate the target scene in a time-multiplexed pattern, with different sets of the beams impinging on the respective regions of the scene at different times.

FIG. 2B is a schematic frontal view of array 22 used in beam source 21, in accordance with an embodiment of the invention. Array 22 in this example comprises eight banks 52, with seventy-two emitters 54, such as VCSELs, in each bank. In this case, array 22 generates 578 beams.

Figure 2C:
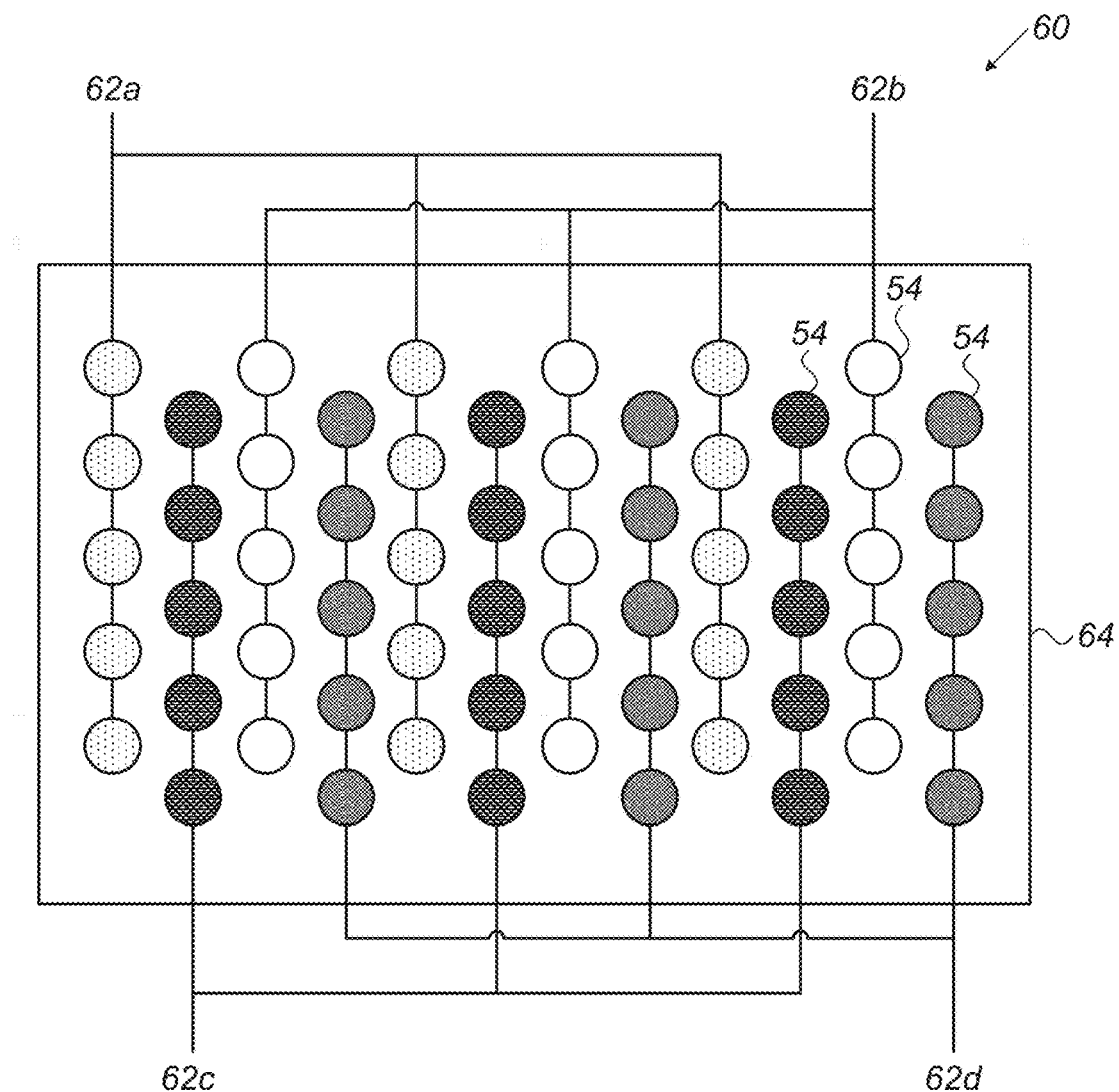
FIG. 2C is a schematic frontal view of an array of emitters that can be used in the radiation source of FIG. 2A, in accordance with another embodiment of the invention.

FIG. 2C is a schematic frontal view of an array 60 of vertical emitters 54 that can be used in beam source 21 in place of array 22, in accordance with another embodiment of the invention. In this case four banks 62a, 62b, 62c and 62d of emitters 54 are interleaved as alternating vertical stripes on a substrate 64, such as a semiconductor chip: Each bank comprises a number of stripes that alternate on the substrate with the stripes in the other banks. Alternatively, other interleaving schemes may be used.

As further alternatives to the pictured embodiments, array 22 may comprise a larger or smaller number of banks and emitters. Typically, for sufficient coverage of the target scenes with static (non-scanned) beams, array 22 comprises at least four banks 52 or 62, with at least four emitters 54 in each bank, and possibly with a DOE for splitting the radiation emitted by each of the emitters.

For denser coverage, array 22 comprises at least eight banks 52 or 62, with twenty emitters 54 or more in each bank. These options enhance the flexibility of system 20 in terms of time-multiplexing of the optical and electrical power budgets, as well as processing resources.

Super-Pixel Selection and Actuation

FIG. 3A is a schematic representation of a pattern of spots 70 of optical radiation that are projected onto target scene 32, in accordance with an embodiment of the invention. Each spot 70 is cast by a corresponding beam 30 (FIG. 1). In the present embodiments, different groups of spots 70 are projected onto scene 32 in alternation, corresponding to the alternating actuation of the corresponding banks 52 of emitters 54 (FIG. 2B).

FIG. 3B is a schematic frontal view of SPAD array 24 onto which target scene 32 is imaged, in accordance with an embodiment of the invention. The sensing elements, such as SPADs, in array 24 are too small to be seen in this figure. Rather, FIG. 3B shows the locations of spots 72 that are reflected from target scene 70 and imaged onto array 24 by lens 34. In other words, each spot 72 is the image on array 24 of a corresponding spot 70 that is projected onto scene 32 by emitter array 22. Lens 34 images a region 74 of target scene 32 (FIG. 3A), including spots 70 that the area contains, onto a corresponding area 76 on array 24.

FIG. 3C is a schematic detail view of area 76 of array 24, showing the locations of spots 72 that are imaged onto the array, in accordance with an embodiment of the invention. These spots 72 may be imaged at the same time, if they originate from the same bank of emitters, or at different, alternating times if they are from different banks. In this view shown in FIG. 3C, it can be seen that array 24 comprises a matrix of sensing elements 78, such as SPADs. (As noted earlier, sensing elements 78 in an array are also referred to as "pixels.") Controller 26 assigns each processing unit 28 to a super-pixel 80 comprising a 2×2 group of the sensing elements 78. In this example, it is assumed that during an initial calibration stage, spots 72 were imaged onto array 24 at locations 72a. Controller 26 thus selected the sensing elements 78 to assign to each super-pixel 80 so as to maximize the overlap between the corresponding spot 72 and the super-pixel, and thus maximize the signal received from each super-pixel.

At some later stage, however, spots 72 shifted to new locations 72b on array 24. This shift may have occurred, for example, due to mechanical shock or thermal effects or due to other causes. Spots 72 at locations 72b no longer overlap with super-pixels 80 in area 76, or overlap only minimally with the super-pixels. Sensing elements 78 on which the spots are now imaged, however, are inactive and are not connected to any of processing units 28. To rectify this situation, controller 26 may recalibrate the locations of super-pixels 80, as described in the above-mentioned provisional patent applications.

Figure 4A:
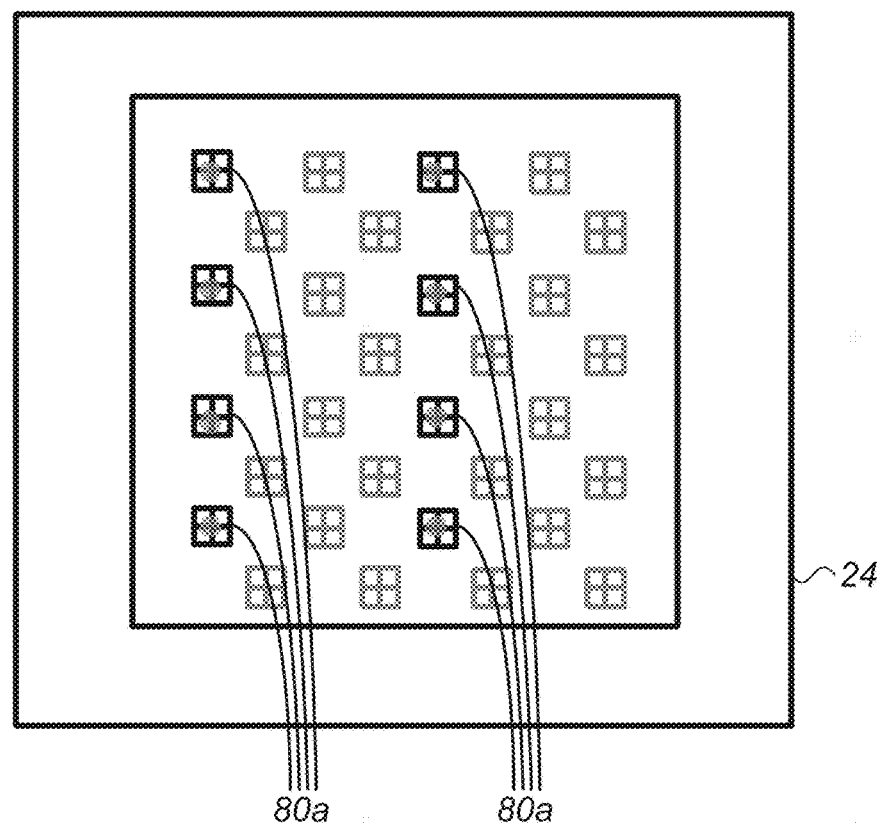
FIGS. 4A and 4B are schematic frontal views of a ToF sensing array showing sets of super-pixels that are selected for activation and readout in two different time periods, in accordance with an embodiment of the invention.
Figure 4B:
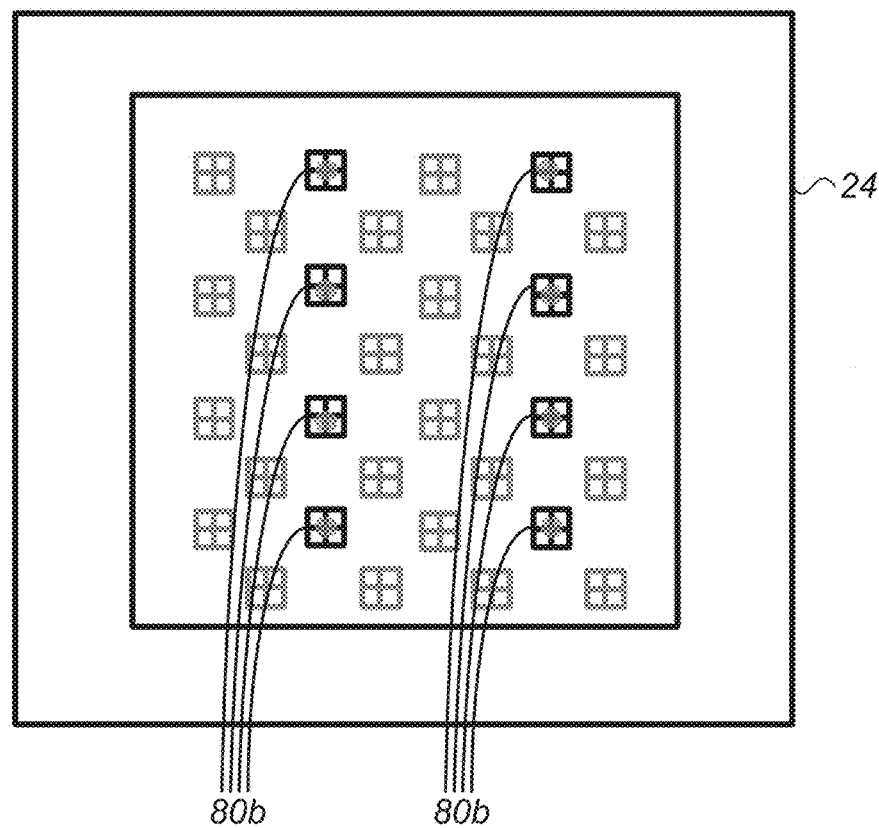

FIGS. 4A and 4B are schematic frontal views of SPAD array 24 showing sets of super-pixels 80a and 80b that are selected for activation and readout in two different time periods, in accordance with an embodiment of the invention. In the embodiment, the selection of the set of super-pixels is synchronized with the selection of banks of emitters. Specifically, assuming array 60 (FIG. 2C) is used for generating the spots on the target scene, super-pixels 80a will be used when bank 62a is actuated, and super-pixels 80b will be used when bank 62b is actuated (and so forth for banks 62c and 62d). Thus, during any given period in the operation of the system 20, processing units 28 serve only the one active set of super-pixels 80, while all other sets remain inactive, in an integrated time-multiplexing scheme.

Figure 5:
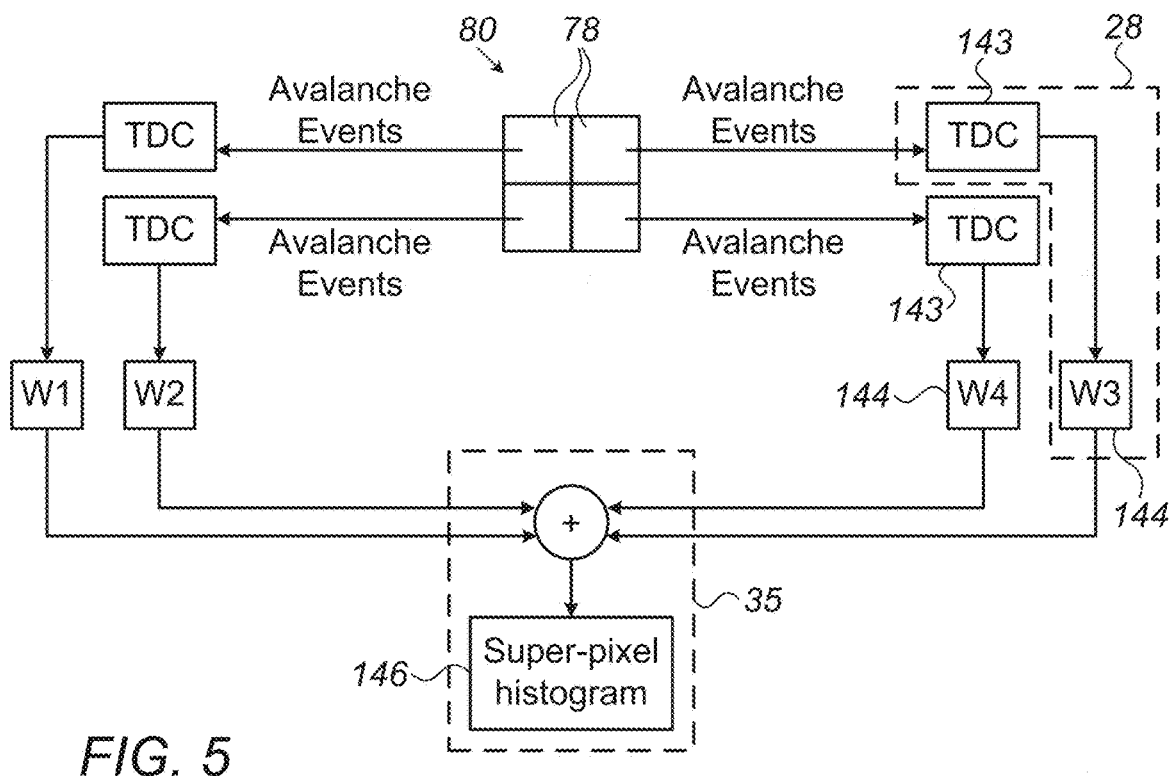
FIG. 5 is a block diagram that schematically illustrates circuitry for processing of signals from a super-pixel, in accordance with an embodiment of the invention.

FIG. 5 is a block diagram that schematically illustrates the processing of signals from a super-pixel 80, in accordance with an embodiment of the invention. In the pictured embodiment, super-pixel 80 comprises four sensing elements 78 of SPAD array 24. Each processing unit 28 comprises one or more time-to-digital converters (TDC) 143, wherein the TDCs are hardware elements translating the avalanche events (signals from a SPAD pixel due to a detected photon) from each sensing element 78 to time-of-arrival information. Each processing unit 28 further comprises, for each TDC 143, a weight 144, and may comprise a histogram unit (not shown), wherein the time-of-arrival information is aggregated into histograms, generally over thousands of pulses from VCSEL array 22. In the present embodiment, however, the histograms are aggregated centrally for super-pixel, without individual histogram units in processing units 28.

In FIG. 5, each processing unit 28 is coupled to a single sensing element 78, thus requiring one TDC 143. Alternatively, processing unit 28 may be coupled to two or more sensing elements 78, and will then comprise a number of TDC's 143 equal to the number of pixels. For example, if each processing unit 28 is coupled to four SPAD pixels 24, the number of TDCs 143 per processing unit will be four, and J=4*M. Additionally or alternatively, as noted earlier, processing units 28 may be switched among different sensing elements 78, which are activated at different, alternating times, in synchronization with the alternating actuation of the corresponding banks 52 of emitters 54 (FIG. 2B).

The time-of-arrival information from the four processing units 28 is aggregated by combining unit 35, using weights 144, to yield a single histogram 146 for super-pixel 80. This combined histogram 146 is sent to DPU 27, which in turn detects, based on histogram 146, whether any object or structure was detected in scene 32 by super-pixel 80 and, if so, reports its depth information based on time-of-flight data.

Additionally, the respective numbers of events reported by the four processing units 28 may be separately summed in combining unit 35 over a predefined interval of arrival times to yield an indication of the received signal strength for that interval for each sensing element 78. Typically the interval is configured to start after the end of a so-called "stray pulse" and continue to the end of the histogram. A stray pulse is a pulse that is generated within system 20 as a result of, for example, an imperfect coating of an optical surface, which causes a reflection of the pulses emitted by VCSEL array 22 directly back into the optical path to SPAD array 24. It is typically an undesired pulse, but one that is very difficult to eliminate altogether. The stray pulse may be utilized for calibrating the timing signals as follows: A time of arrival of a stray pulse is recorded and subtracted from a subsequent timing signal due to a laser pulse that has been reflected by scene 32. This subtraction yields a relative time-of-flight for the received laser pulse, and compensates for any random firing delays of VCSEL array 22, as well as for most of the VCSEL and SPAD drifts related to temperature changes.

These four indicators of signal strength are also transferred to DPU 27 (in conjunction with combined histogram 146). The indicators may be used by DPU 27 to determine a precise location of the spot on sensing elements 78.

In some embodiments, the four units of TDC 143, as well as combining unit 35, reside in the same chip as SPAD array 24, while the rest of signal processing, including DPU 27, resides in separate controller 26. A major reason for generating single combined histogram 146 for super-pixel 80 is to reduce the information that is transferred from SPAD array 24 to DPU 27 and to controller 26. The partitioning into two separate units reflects the fact that SPAD array 24 and the associated units perform primarily optical and analog functions, while controller 26 performs mostly digital and software-driven operations.

Super-Pixel Calibration by Search in Precomputed Regions

Figure 6:
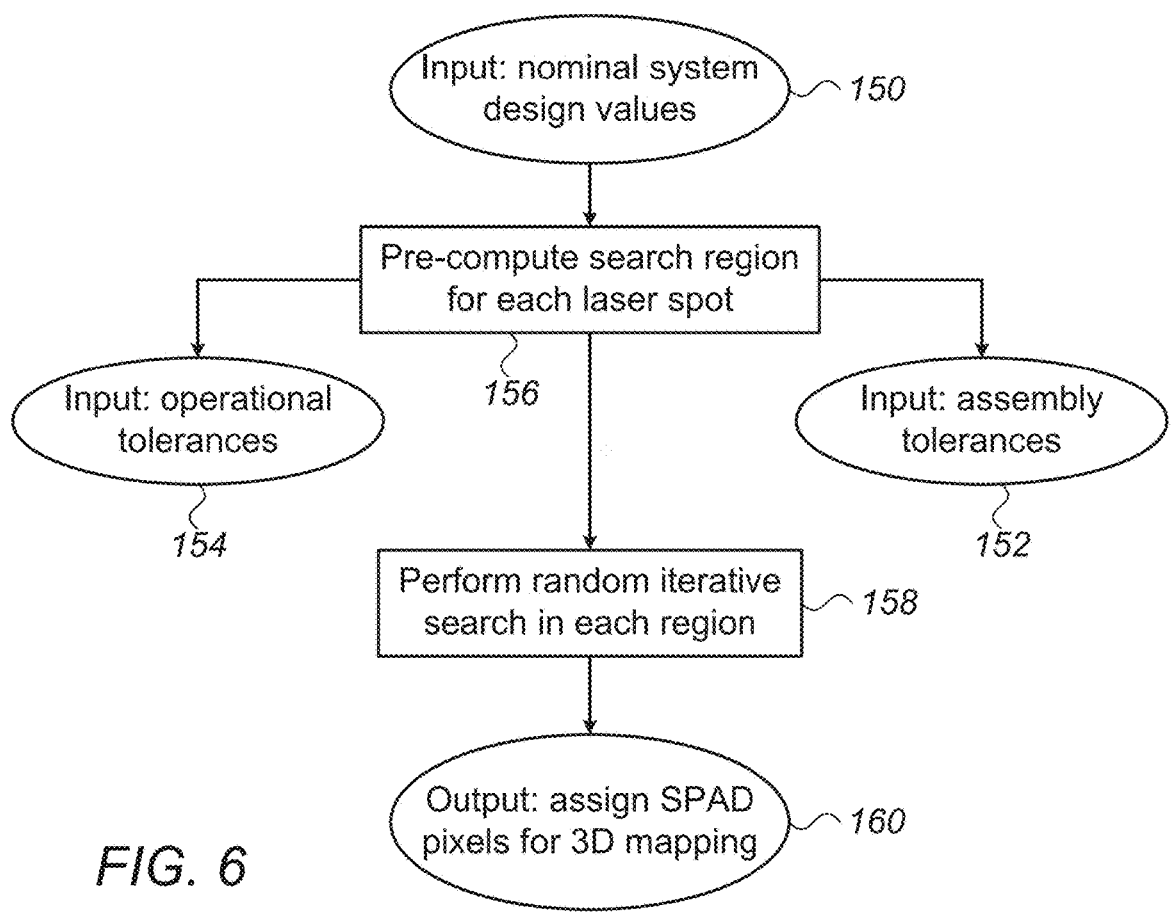
FIG. 6 is a flowchart that schematically illustrates a method for identifying the pixels on a SPAD array that receive laser spots, in accordance with an embodiment of the invention.

FIG. 6 is a flowchart that schematically illustrates a method for identifying the pixels in a sensing array that receive laser spots, in accordance with an embodiment of the invention. This method is described, for the sake of convenience and clarity, with reference to SPAD array 24 and the other elements of system 20 (FIG. 1). The method can be performed, for example, each time system 20 is turned on. Alternatively, the method can be carried out prior to an initial use of system 20, and the results can be stored for future use. The method can then be repeated periodically and/or when system performance indicates that recalibration may be required.

Alternatively, however, the principles of this method may be applied, mutatis mutandis, in other depth mapping systems of similar configuration. For example, VCSEL array 22 could be replaced by a single laser (or a small number of lasers), with a beamsplitting element, such as a diffractive optical element (DOE), to split the laser output into multiple beams. As another example, other types of sensing arrays, comprising other sorts of detector elements, could be used in place of SPADs. The method of FIG. 7, as described below, is similarly applicable not only to system 20, but to other depth mapping systems, as well.

In the method of FIG. 6, three input steps: a nominal design value step 150, an assembly tolerance step 152, and an operational tolerance step 154, provide inputs for a pre-computation step 156. Design value step 150 provides the nominal system design values for depth mapping system 20 (FIG. 1); assembly tolerance step 152 provides the assembly tolerances of the depth mapping system; and operational tolerance step 154 provides expected operational tolerances, such as variations of ambient temperature and the effects of a mechanical shock on the depth mapping system.

The above inputs include multiple parameters. For example, a typical focal length of collection lens 34 has a nominal value of 2 mm, an assembly tolerance of 0.1 mm and an operational tolerance of 0.05 mm. Each tolerance is normally distributed around zero, with a standard deviation equal to the above tolerance. The probability distribution of the focal length is a normal distribution combined from the two normal distributions and centered at the nominal value of 2 mm. An additional example of a parameter is the baseline between VCSEL array 22 and SPAD array 24. The multiple parameters, such as the two examples described above, allow controller 26 to model accurately the optical path taken by the laser pulses and thus calculate the locations where the spots impinge on SPAD array 24.

Based on these inputs, controller 26 calculates a search region for each of the M laser spots expected on SPAD array 24 (FIG. 1), in a pre-computation step 156. Each search region includes a group of pixels for which a probability of receiving a laser beam reflected from scene 32 is estimated to be higher than a preset threshold, such as 99.9%. As an example of the calculations performed by controller 26, an increase of 1% in the focal length of collection lens 34 magnifies the image on SPAD array 24 by 1%, thus shifting the spots in an outward radial direction. The probability distribution of this parameter and all other parameters of the input translates to a region around each of the nominal spot locations on SPAD array 24 in which there is a probability higher than 99.9% to find the spot.

Once the search regions have been chosen in pre-computation step 156, controller 26, in a random iterative search step 158, fires a succession of pulses of beams 32 from VCSEL array 22 (FIG. 1), and at the same time performs random searches within the search regions to identify the M super-pixels that receive the pulsed beams.

Alternatively, controller 26 may apply other search strategies, not necessarily random, within the search regions. During step 158, each processing unit 28 is coupled to receive signals from a different pixel following each laser pulse or sequence of multiple pulses, and controller 26 checks, using DPU 27, which pixels have output signals due to an incident photon, and which have not. Based on the results, controller 26 selects the pixels to include in each super-pixel as those on which the photons were found to be incident. In simulations, the search was found to converge within a succession of 8-10 repeated sequences of pulsed beams 32 and thus identify the M super-pixels of SPAD array 24 that receive the M beams.

Once controller 26 has found the M super-pixels, it finishes the search and assigns, in an assignment step 160, these super-pixels for use in 3D mapping of scene 32 by depth mapping system 20.

Two-Stage Solution for Super-Pixel Calibration

Figure 7:
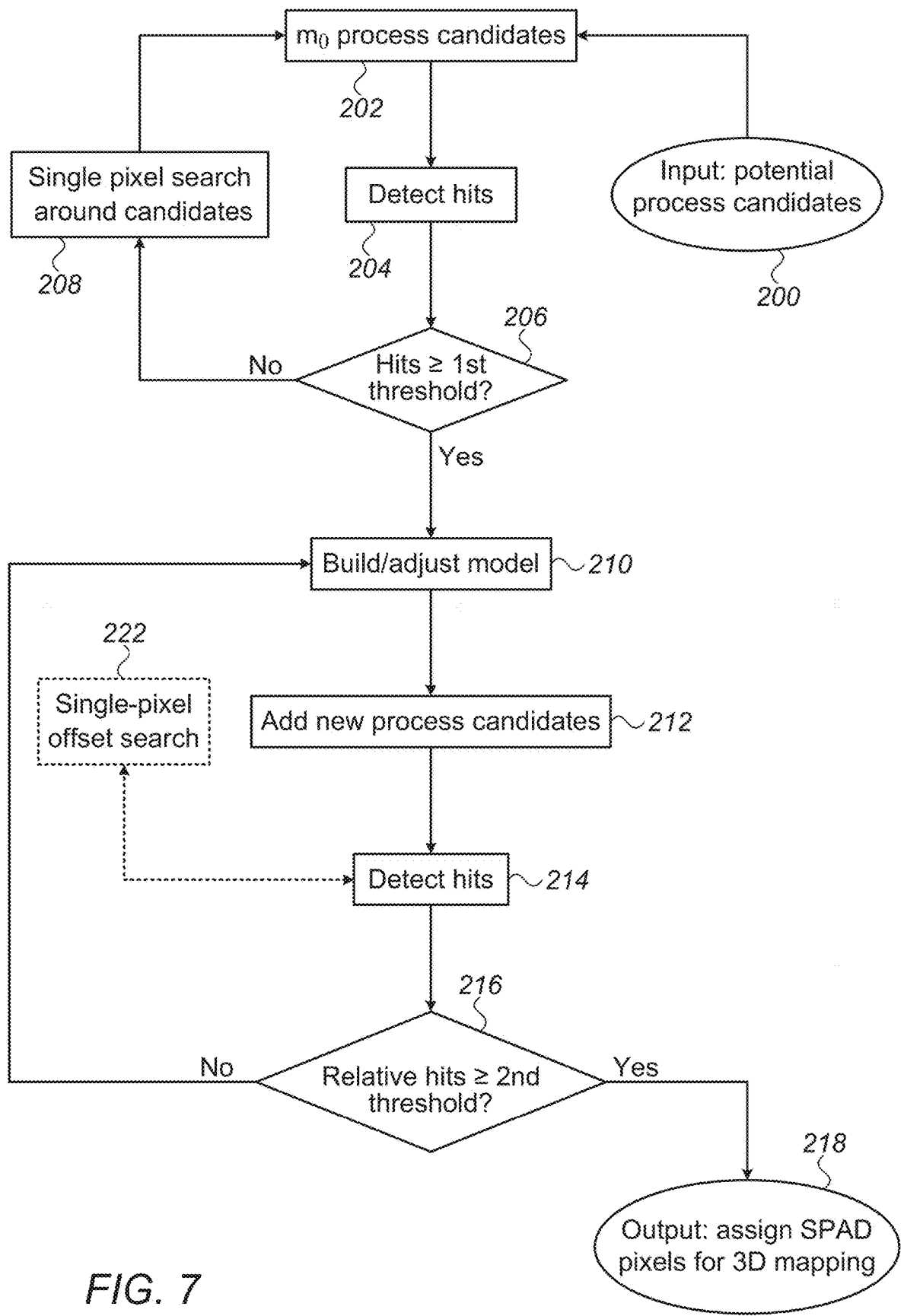
FIG. 7 is a flowchart that schematically illustrates a method for identifying the pixels on a SPAD array that receive laser spots, in accordance with another embodiment of the invention.

FIG. 7 is a flowchart that schematically illustrates a two-stage method for identifying the super-pixels in SPAD array 24 (FIG. 1) that receive laser spots, in accordance with another embodiment of the invention. The first stage starts by providing, in an input step 200, a small number $m_0$ of potential process candidates, wherein, in this context, the term "process candidate" is used for those SPAD super-pixels likely to receive laser spots. A typical number for potential process candidates is either a fixed number, such as $m_0=5$, or a percentage, such as 10%, of the number M. These potential process candidates may be obtained, for example, from a previous use of depth mapping system 20.

These potential candidates are coupled to respective processing units 28, in a candidate processing step 202. In a first detection step 204, controller 26 fires a sequence of pulses of beams 32 from VCSEL array 22 and queries processing units 28 and combining unit 35 to find out how many of the $m_0$ process candidates on SPAD array 24 reported "hits," i.e., output signals indicating that they had received photons. In a first comparison step 206, controller 26 checks whether the number of reported hits in first detection step 204 exceeds a first preset threshold, for example 8% of M (if initially 10% of M were selected as process candidates).

If the number of hits was below the threshold, controller 26 searches, in a search step 208, for hits in the areas around the process candidates by firing successive pulsed beams 32 from VCSEL array 22 and performing a single pixel search around the candidates. After new hits have been identified, the previous process candidates in process candidate step 202 are replaced by the new hits, and steps 204 and 206 are repeated until the number of detected hits in first comparison step 206 exceeds the first preset threshold.

The detected hits in first comparison step 206 are used by controller 26 to build a model in a modeling step 210. The model expresses the deviation of the locations of the hits in SPAD array 24 relative to their nominal locations, i.e., the locations where the reflected laser beams were expected to be incident on SPAD array 24 according to the design geometry of system 20, for example. The model may be a quadratic model, a simplified pinhole camera model, or a homographic model, for example, and it may take into account system tolerances as previously described.

A homographic model h is an eight-parameter transformation $(h_1, \ldots, h_8)$, mapping a point $p=(x,y)$ to another point $p'=(x',y')$ through the relation:

$$(x', y') = \left( \frac{h_1 x + h_2 y + h_3}{h_7 x + h_8 y + 1}, \frac{h_4 x + h_5 y + h_6}{h_7 x + h_8 y + 1} \right)$$

The coordinates x and y refer to Cartesian coordinate system 33 of FIG. 1. Such a model represents the correct spot locations on SPAD array 24 in a case where scene 34 comprises a plane (for instance, a wall).

A quadratic model is given by:

$$x' = a_1 + b_1 x + c_1 y + d_1 x^2 + e_1 y^2 + f_1 xy$$

$$y' = a_2 + b_2 x + c_2 y + d_2 x^2 + e_2 y^2 + f_2 xy$$

The equations of a simplified pinhole camera model are as follows: Given a point (x,y,z) in Cartesian coordinate system 33, we first compute the undistorted image coordinates:

$$x_u = f\frac{X}{Z} + c_x, \quad y_u = f\frac{Y}{Z} + c_y.$$

We then apply a distortion operation to obtain the final image coordinates:

$$x_d = c_x + (x_u - c_x) \cdot p(r), y_d = y + (y_u - c_y) \cdot p(r),$$

where $$r = \sqrt{(x_u - c_x)^2 + (y_u - c_y)^2}$$

and $p(r) = 1 + k_1 r^2 + k_2 r^4 + k_3 r^6$ is a distortion polynomial. The parameters of the model are, therefore, the following constants: f, $c_x$, $c_y$, $k_1$, $k_2$, $k_3$ (see G. Bradski and A. Kaehler, *Learning OpenCV*, $1^{st}$ edition, O'Reilly Media, Inc., Sebastopol, California, 2008).

Additionally or alternatively, other models, such as splines or more elaborate models that describe the optics of system 20 to a higher degree of complexity, may be employed.

Based on one of the above models, controller 26 predicts the locations of a number of new process candidates, by applying the model to the nominal locations of a number of additional pixels where other reflected laser beams were expected to be incident, in a candidate addition step 212, making now up a total of $m_1$ process candidates. Typically, $m_1$ increases in each iteration at candidate addition step 212. In a second detection step 214 controller 26 fires an additional sequence of pulses of beams 30 from VCSEL array 22 and queries how many of the $m_1$ process candidates on SPAD array 24 have reported hits.

In a second comparison step 216, controller 26 compares the relative number of hits (the ratio between the hits and the total number M of pulsed beams 30) to a second preset threshold. This latter threshold is typically set to a high value, corresponding to a situation in which the large majority of beams 30 are successfully received by corresponding super-pixels. If the relative number of hits is less than the second preset threshold, controller 26 adjusts the model in modeling step 210 based on the detected hits. The adjustment of the model includes recalculating the model coefficients, as well as, where required, an increase in the complexity of the model. In an iterative process, of 5-8 loops, for example, controller 26 adds new process candidates based on the model in candidate addition step 212, queries hits in second detection step 214, and compares their relative number to the second preset threshold in second comparison step 216. As long as the relative number of hits does not exceed the second preset threshold, controller 26 keeps looping back to model step 210, improving the model based on the new hits.

Once the relative number of detected hits exceeds the second preset threshold, controller 26 finishes the search and assigns, in an assignment step 218, the detected hits for use in 3D mapping of scene 32 by depth mapping system 20.

In case the number of process candidates at step 214 does not increase at a given stage of the iteration and is still too low, controller 26 may initiate a single-pixel offset search in an offset search step 222. In offset search step 222, a search for the yet undetected laser spots is performed with a single-pixel offset around their expected locations.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Depth sensing apparatus, comprising:
a radiation source, comprising a first array of emitters arranged in multiple banks, which are configured to emit a first plurality of pulsed beams of optical radiation toward a target scene;
a second plurality of sensing elements, which are arranged in a second array and are configured to output signals indicative of respective times of incidence of photons on the sensing elements, wherein the second plurality exceeds the first plurality;
objective optics configured to form an image of the target scene on the array of sensing elements; and
processing and control circuitry, which is coupled to actuate the multiple banks in alternation to emit the pulsed beams and is coupled to receive the signals from the sensing elements, and which is configured to search over the sensing elements in order to identify, responsively to the signals, areas of the second array on which the pulses of optical radiation reflected from corresponding regions of the target scene are incident, and to process the signals from the sensing elements in the identified areas in order measure depth coordinates of the corresponding regions of the target scene based on the times of incidence.

2. The apparatus according to claim 1, wherein the emitters in the array comprise vertical-cavity surface-emitting lasers (VCSELs).

3. The apparatus according to claim 1, wherein the multiple banks comprise at least four banks, each bank containing at least four of the emitters.

4. The apparatus according to claim 3, wherein the radiation source comprises a diffractive optical element (DOE) which is configured to split the optical radiation emitted by each of the emitters into multiple ones of the pulsed beams.

5. The apparatus according to claim 3, wherein the at least four banks comprise at least eight banks.

6. The apparatus according to claim 3, wherein each bank contains at least twenty of the emitters.

7. The apparatus according to claim 3, wherein the banks of emitters are interleaved on a substrate.

8. The apparatus according to claim 1, wherein the sensing elements comprise single-photon avalanche diodes (SPADs).

9. The apparatus according to claim 1, wherein the processing and control circuitry is configured to group the sensing elements in each of the identified areas together to define super-pixels, and to process together the signals from the sensing elements in each of the super-pixels in order to measure the depth coordinates.

10. The apparatus according to claim 9, wherein the processing and control circuitry comprises multiple processing units, wherein each of the processing units is coupled to process the signals from a respective one of the super-pixels.

11. The apparatus according to claim 9, wherein each of the processing units is configured to construct a histogram of the times of incidence of the photons on the sensing elements in each of the super-pixels.

12. The apparatus according to claim 1, wherein the pulses of the optical radiation emitted from the multiple banks of the emitters are incident, after reflection from the target scene, on different, respective sets of the identified areas of the second array, and wherein the processing and control circuitry is configured to receive and process the signals from the sensing elements in the respective sets in synchronization with actuation of the multiple banks.

13. The apparatus according to claim 12, wherein when any given bank of the emitters is actuated, the processing and control circuitry is configured to read and process the signals only from the sensing elements in a corresponding set of the identified areas of the second array, while the remaining sensing elements in the array are inactive.

14. A method for depth sensing, comprising:
driving a first array of emitters arranged in multiple banks to emit a first plurality of pulsed beams of optical radiation toward a target scene, while actuating the multiple banks in alternation to emit the pulsed beams;
forming an image of the target scene on a second plurality of sensing elements, which are arranged in a second array and are configured to output signals indicative of respective times of incidence of photons on the sensing elements, wherein the second plurality exceeds the first plurality;
searching over the sensing elements in order to identify, responsively to the signals from the sensing elements, areas of the second array on which the pulses of optical radiation reflected from corresponding regions of the target scene are incident; and
processing the signals from the sensing elements in the identified areas in order measure depth coordinates of the corresponding regions of the target scene based on the times of incidence.

15. The method according to claim 14, wherein the multiple banks comprise at least four banks, each bank containing at least four of the emitters.

16. The method according to claim 15, wherein the banks of emitters are interleaved on a substrate.

17. The method according to claim 14, wherein processing the signals comprises grouping the sensing elements in each of the identified areas together to define super-pixels, and processing the signals from the sensing elements in each of the super-pixels together in order to measure the depth coordinates.

18. The method according to claim 17, wherein processing the signals together comprises constructing a histogram of the times of incidence of the photons on the sensing elements in each of the super-pixels.

19. The method according to claim 14, wherein the pulses of the optical radiation emitted from the multiple banks of the emitters are incident, after reflection from the target scene, on different, respective sets of the identified areas of the second array, and wherein processing the signals comprises receiving and processing the signals from the sensing elements in the respective sets in synchronization with actuation of the multiple banks.

20. The method according to claim 19, wherein processing the signals comprises, when any given bank of the emitters is actuated, reading and processing the signals only from the sensing elements in a corresponding set of the identified areas of the second array, while the remaining sensing elements in the array are inactive.

* * * * *